United States Patent
Bao et al.

(10) Patent No.: US 12,119,825 B2
(45) Date of Patent: Oct. 15, 2024

(54) FREQUENCY MULTIPLIER WITH BALUN FUNCTION

(71) Applicant: Telefonaktiebolaget LM Ericsson (publ), Stockholm (SE)

(72) Inventors: Mingquan Bao, Västra Frölunda (SE); Yinggang Li, Askim (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 42 days.

(21) Appl. No.: 17/780,618

(22) PCT Filed: Dec. 10, 2019

(86) PCT No.: PCT/EP2019/084521
§ 371 (c)(1),
(2) Date: May 27, 2022

(87) PCT Pub. No.: WO2021/115579
PCT Pub. Date: Jun. 17, 2021

(65) Prior Publication Data
US 2023/0353131 A1 Nov. 2, 2023

(51) Int. Cl.
*H03K 5/00* (2006.01)
*H03H 11/04* (2006.01)
(Continued)

(52) U.S. Cl.
CPC ..... *H03K 5/00006* (2013.01); *H03H 11/0405* (2013.01); *H03K 17/60* (2013.01); *H03K 17/6871* (2013.01)

(58) Field of Classification Search
CPC ............... H03K 17/6871; H03K 17/60; H03K 5/00006; H03B 19/14; H03B 19/16
See application file for complete search history.

(56) References Cited

U.S. PATENT DOCUMENTS 2,907,944 A 10/1959 Hume
6,066,997 A 5/2000 Matsugatani et al.
(Continued)

FOREIGN PATENT DOCUMENTS

GB 1084507 A 9/1967

OTHER PUBLICATIONS

Sun et al. ("A Broadband High Suppression Frequency Doubler IC for Sub-Millimeter-Wave UWB Applications", IEICE Transactions on Fundamentals of Electronics, Communications and Computer Sciences, vol. E94-A No. 2, Feb. 1, 2011, pp. 603-610, Institute of Electronics, Information, and Communication Engi) (Year: 2011).*
(Continued)

*Primary Examiner* — Patrick C Chen
(74) *Attorney, Agent, or Firm* — Coats and Bennett, PLLC

(57) ABSTRACT

Frequency multipliers (300) for generating a differential output signal from a single-ended input signal are disclosed. The frequency multiplier comprises a single-ended input ($P_{in}(f_0)$) to receive the input signal with a frequency of $f_0$ and differential outputs ($+/-P_{out}(2nf_0)$) to provide the differential output signals. The frequency multiplier further comprises a first signal branch (301) connected to the single-ended input and one of the differential outputs ($+P_{out}(2nf_0)$). The first signal branch comprises a first low pass or bandpass filter with a center frequency of $f_0$ (L/BPF1), a first nonlinear component (NC1) and a first high pass or bandpass filter with a center frequency of $2nf_0$ (H/BPF1). The frequency multiplier further comprises a second signal branch connected to the single-end input and another one of the differential outputs ($-P_{out}(2nf_0)$). The second signal branch comprises a second low pass or bandpass filter with a center frequency of $f_0$ (L/BPF1), a second nonlinear component (NC2) and a second high pass or bandpass filter with a center
(Continued)

frequency of $2nf_0$ (H/BPF2). The first and second nonlinear components are configured such that even-order harmonics generated in the first and second nonlinear components are in anti-phase, thereby the differential output signals with a frequency of 2n times the frequency of the input signal are generated at the differential output, where n is an integer number.

12 Claims, 6 Drawing Sheets

(51) Int. Cl.
  *H03K 17/60* (2006.01)
  *H03K 17/687* (2006.01)

(56) References Cited

U.S. PATENT DOCUMENTS

| | | | | |
|---|---|---|---|---|
| 6,124,742 | A * | 9/2000 | Cook | H03B 19/14 327/119 |
| 7,091,757 | B2 * | 8/2006 | Masuda | H03B 19/00 327/119 |
| 2002/0024411 | A1 * | 2/2002 | Uchino | H03B 19/14 327/119 |

OTHER PUBLICATIONS

Henderson, B. et al., "Wideband GaAs MMIC Diode Frequency Doubler Using 4:1 Broadside Coupled Balun", 2017 IEEE MTT-S International Microwave Symposium (IMS), Jun. 4, 2017, pp. 957-960, IEEE.

Shkalikov, V., "The Phase of the Output Oscillations in a Frequency Converter Having Symmetrical Nonlinear Elements", Telecommunications & Radio Engineering, vol. 29/30 No. 8, Aug. 31, 1975, pp. 116-117.

Hrobak, M. et al., "Design and Fabrication of Broadband Hybrid GaAs Schottky Diode Frequency Multipliers", IEEE Transactions on Microwave and Techniques, vol. 61 No. 12, Dec. 1, 2013, pp. 4442-4460, IEEE.

Sun, J. et al., "A Broadband High Suppression Frequency Doubler IC for Sub-Millimeter-Wave UWB Applications", IEICE Transactions on Fundamentals of Electronics, Communications and Computer Sciences, vol. E94-A No. 2, Feb. 1, 2011, pp. 603-610, Institute of Electronics, Information, and Communication Engineers.

Carpenter, S. et al., "Balanced Active Frequency Multipliers in D and G bands Using 250nm InP DHBT Technology", 2017 IEEE Compound Semiconductor Integrated Circuit Symposium (CSICS), Oct. 22, 2017, pp. 1-4, IEEE.

Piernas, B. et al., "Analysis of Balanced Active Doubler for Broad-Band Operation—The Frequency-Tuning Concept", IEEE Transactions on Microwave Theory and Techniques, vol. 50 No. 4, Apr. 1, 2002, pp. 1120-1126, IEEE.

Nguyen, C., "A 35% Bandwidth Q-to-W-Band Frequency Doubler", Microwave Journal, vol. 30 No. 9, Sep. 30, 1987, pp. 232-235.

Shim, D. et al., "150 GHz Complementary Anti-Parallel Diode Frequency Tripler in 130 nm CMOS", IEEE Microwave and Wireless Components Letters, vol. 21 No. 1, Jan. 1, 2011, pp. 43-45, IEEE.

\* cited by examiner

FREQUENCY MULTIPLIER WITH BALUN FUNCTION

TECHNICAL FIELD

Embodiments herein relate to a frequency multiplier. In particular, they relate to an even-order frequency multiplier for generating differential output signals from a single-ended input signal.

BACKGROUND

Wireless communication systems comprise almost exclusively receivers and transmitters. At microwave and millimeter-wave frequencies, frequency multipliers are often used in the transmitters and receivers to convert the frequency of a local oscillator (LO) from low to high. Specifically, a frequency multiplier multiplies an input signal with a low frequency f0, to an output signal with a desired high frequency fout, where fout=m*f0, and m is an integer called multiplication factor. Often, the multiplier is required to have differential outputs to drive a balanced mixer to make use of advantages of a balanced topology against a single-ended topology. Two kinds of configurations are often used for differential high frequency signal generation. FIG. 1(a) shows a frequency multiplier cascaded by a balun which converts a single-ended or unbalanced signal from the frequency multiplier to a differential or balanced output signal. FIG. 1(b) shows a phase shifter cascaded with a frequency multiplier configuration. There are two signal branches each comprises a phase shifter cascaded with a frequency multiplier. In one of the signal branch, a/m degree phase shift is created, and in the other one, b/m degree phase shift is created, where a−b=1800. For instance, for m=2, a frequency doubler configuration is shown in FIG. 2, where a 900 hybrid acts as a phase shifter. Therefore, to get a differential output, either a balun or a phase shifter, i.e. 900 hybrid, is needed. Balun and 900 hybrid are usually built based on transmission lines or coupled transmission lines with a length of one quarter-wavelength. Passive components based on quarter-wavelength transmission lines occupy large chip area. Further, balun or phase shifter adds certain loss, which usually increases with frequency. Furthermore, balun or phase shifter often limits the bandwidth of the frequency multiplier.

SUMMARY

Therefor it is an object of embodiments herein to provide a frequency multiplier with differential output with improved performance.

According to a first aspect of embodiments herein, the object is achieved by a frequency multiplier for generating differential output signals from a single-ended input signal. The frequency multiplier comprises a single-ended input to receive the input signal with a frequency of f0 and differential outputs to provide the differential output signals. The frequency multiplier further comprises a first signal branch connected to the single-ended input and one of the differential outputs, wherein the first signal branch comprises a first low pass filter or a bandpass filter with a center frequency of f0, a first nonlinear component and a first high pass filter or a bandpass filter with a center frequency of 2nf0. The frequency multiplier further comprises a second signal branch connected to the single-end input and another one of the differential outputs, wherein the second signal branch comprises a second low pass filter or a bandpass filter with a center frequency of f0, a second nonlinear component and a second high pass filter or a bandpass filter with a center frequency of 2nf0. The first and second nonlinear components are configured such that even-order harmonics generated in the first and second nonlinear components are in anti-phase, thereby the differential output signals with a frequency of 2n times the frequency of the input signal are generated at the differential outputs, where n is an integer number.

In other words, the frequency multiplier according to the embodiments herein is an even-order frequency multiplier. The input signals with the same amplitude and phase are applied to the two signal branches. Each signal branch has a nonlinear component, i.e., a diode or a transistor. The even-order harmonics generated in the two nonlinear components are anti-phase, i.e. 1800 phase difference, so that the differential output signals can be generated without using a phase shifter or balun. High pass or bandpass filters are used for extracting the desired harmonic so that the output signals with the frequency of 2nf0, i.e. 2n times the frequency of the input signal are extracted out and other undesired harmonics are filtered out or suppressed. The high pass or bandpass filters are used also for impedance matching.

There are advantages associated with the frequency multiplier according to embodiments herein. As can be seen, neither a balun nor a phase shifter is needed in the frequency multiplier, the losses associated with the balun or the phase shifter is thus eliminated. Furthermore, there is no bandwidth limitation associated with a balun or a phase shifter. Thus, the frequency multiplier supports wideband operation. Without a balun or a phase shifter the frequency multiplier also becomes more compact.

Thus, embodiments herein provide a single-ended input and differential outputs frequency multiplier which is compact and features wide bandwidth and low losses.

BRIEF DESCRIPTION OF THE DRAWINGS

Examples of embodiments herein are described in more detail with reference to attached drawings in which.

DETAILED DESCRIPTION

There are different kinds of frequency multipliers which utilize nonlinear characteristics of active devices such as transistors or diodes to generate high frequency signals. The nonlinearity of the transistor or diode is utilized to generate harmonics of the input signal, and the desired harmonic is extracted as the output of the frequency multiplier by using e.g. a filter.

Figure 1:
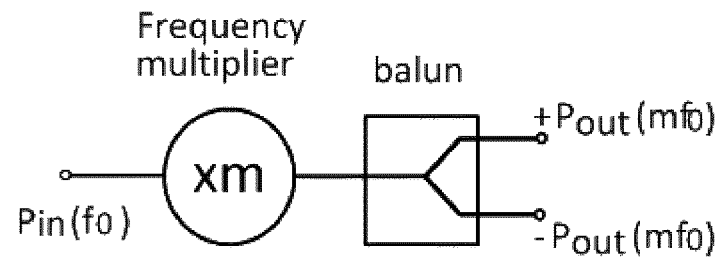
FIG. 1 is schematic block view of frequency multipliers according to prior art.
Figure 1:
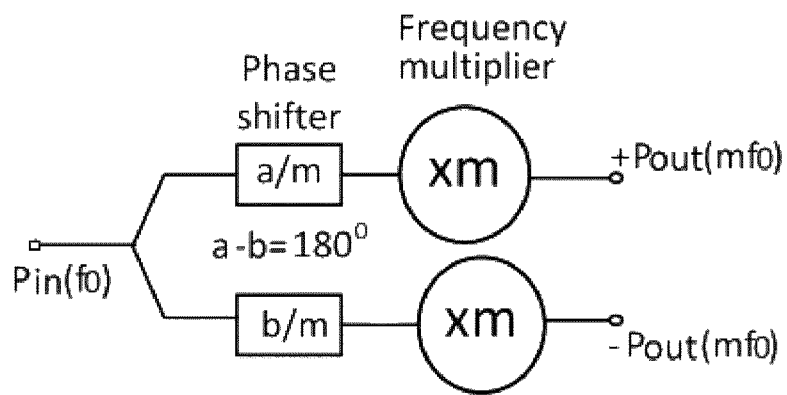
Figure 2:
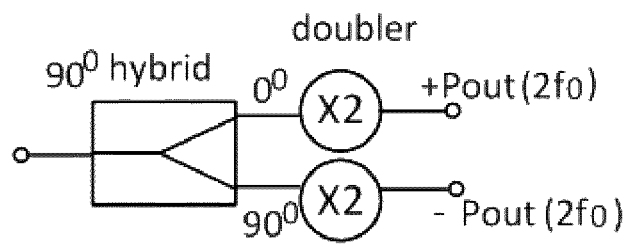
FIG. 2 is schematic block view of a frequency doubler according to prior art.
Figure 3:
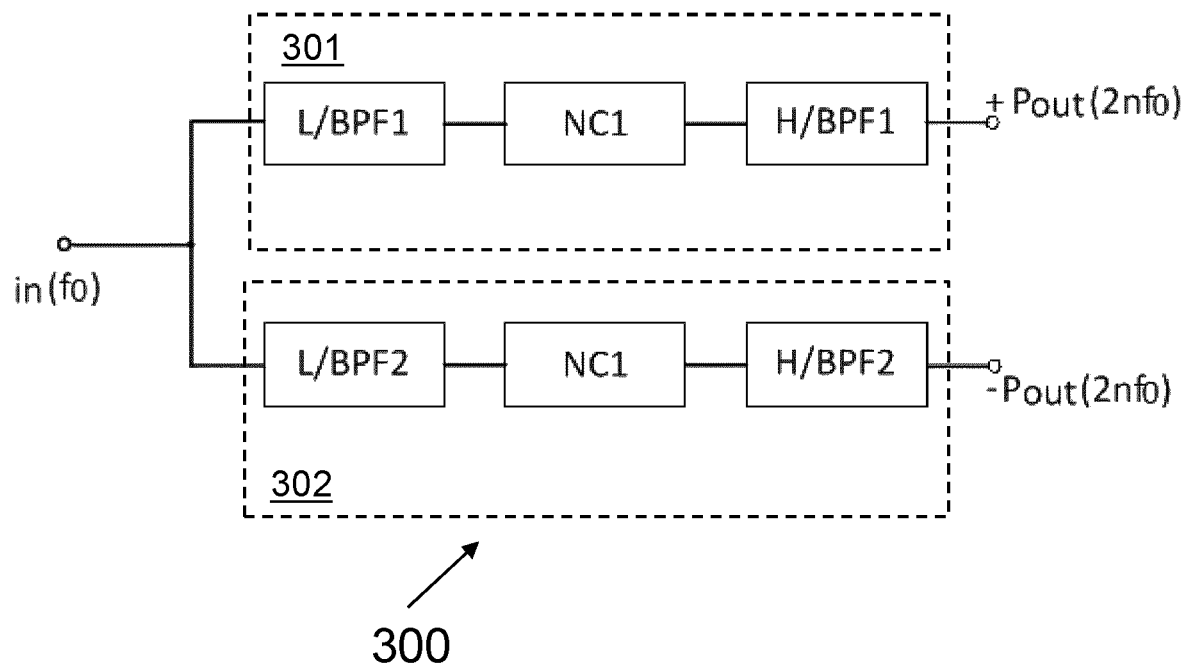
FIG. 3 is a general view of a frequency multiplier according to embodiments herein.

According to the embodiments herein, a general view of an even-order frequency multiplier 300 for generating a differential output signal from a single-ended input signal is shown in FIG. 3. The frequency multiplier 300 comprises a single-ended input $P_{in}(f_0)$ to receive the input signal with a frequency of $f_0$ and differential outputs $+P_{out}(2nf_0)/-P_{out}(2nf_0)$ to provide the differential output signals.

The frequency multiplier 300 further comprises a first signal branch 301 connected to the single-ended input $P_{in}(f_0)$ and one of the differential outputs $+P_{out}(2nf_0)$. The first signal branch 301 comprises a first low pass or bandpass filter with a center frequency of $f_0$, L/BPF1, a first nonlinear component NC1 and a first high pass or bandpass filter with a center frequency of $2nf_0$, H/BPF1.

The frequency multiplier 300 further comprises a second signal branch 302 connected to the single-ended input $P_{in}(f_0)$ and another one of the differential outputs $-P_{out}(2nf_0)$. The second signal branch 302 comprises a second low pass or bandpass filter with a center frequency of $f_0$, L/BPF2, a second nonlinear component NC2 and a second high pass or bandpass filter with a center frequency of $2nf_0$, H/BPF2.

The first and second nonlinear components NC1, NC2 are configured such that even-order harmonics generated in the first and second nonlinear components are in anti-phase, thereby the differential output signals with a desired frequency of $2nf_0$, i.e. 2n times the frequency of the input signal $f_0$, are generated at the differential outputs, where n=1, 2, . . . is an integer number.

In the following, when it is described that a node or terminal is grounded or is connected to ground, it means both direct current (DC) and alternating current (AC) of this node or terminal is grounded. When a node or terminal is AC grounded or is connected to a signal ground, it means AC of the node is grounded but not the DC of the node. When a node or terminal is DC grounded, it means DC of this node is grounded but not the AC.

Figure 4:
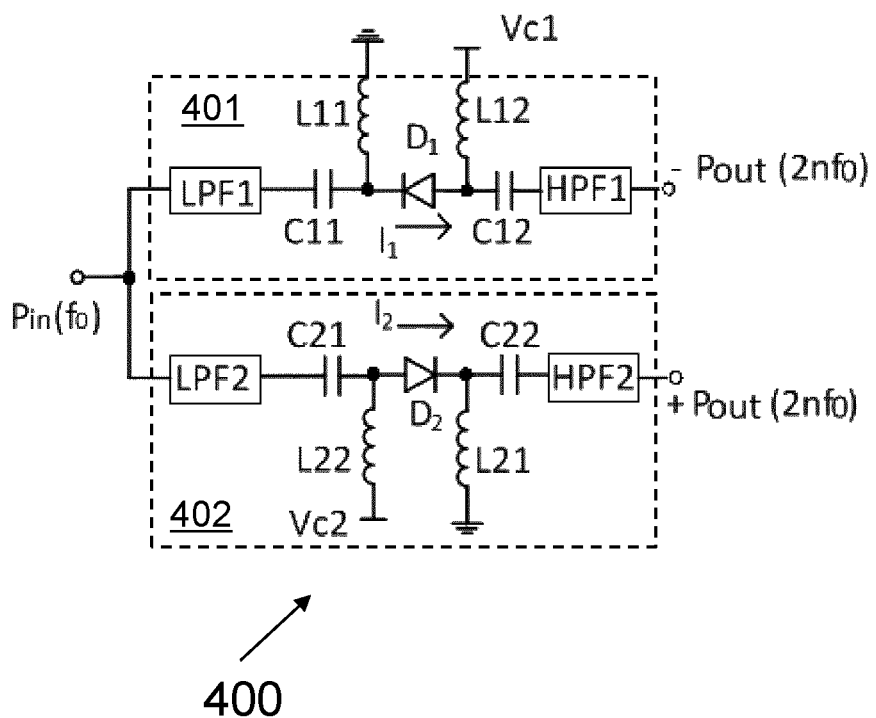
FIG. 4 is schematic block view of a frequency multiplier according to a first embodiment herein.

According to some embodiments, the first and second nonlinear components NC1, NC2 may be diodes and connected in series in the first and second signal branches. FIG. 4 shows a frequency multiplier 400 with an anti-parallel diode pair D1, D2. As shown in FIG. 4, in the first signal branch 401, the cathode of the first diode D1 is connected with the single-ended input $P_{in}(f_0)$ via a capacitor C11 and the first low pass or bandpass filter LPF1, the anode of the first diode D1 is connected with one of the differential outputs $-P_{out}(2nf_0)$ via a capacitor C12 and the first high or bandpass filter HPF1. In the second signal branch 402, the anode of the second diode D2 is connected with the single-ended input $P_{in}(f_0)$ via a capacitor C21 and the second low pass or bandpass filter LPF2 and the cathode of the second diode D2 is connected with one of the differential outputs $+P_{out}(2nf_0)$ via a capacitor C22 and the second high or bandpass filter HPF2. The cathodes of two diodes D1, D2 are connected to ground via respective inductors L11, L21, while the anodes of two diodes D1, D2 are connected to DC voltage suppliers Vc1, Vc2 via inductors L12, L22 respectively.

Capacitors C11, C12, C21, C22 are for AC coupling or for DC block, and inductors L11, L12, L21, L21 are AC choke, to block leakage of AC signal to the signal ground. Two diodes D1, D2 are biased by Vc1 and Vc2 separately. Vc1 may be equal to Vc2. Two diodes D1, D2 form an anti-parallel pair.

In this circuit, the AC voltages $V_d$ across two diodes are anti-phase, i.e. 180° phase difference, so are the AC currents Id through two diodes, flowing from anode to cathode. Assuming the $I_d-V_d$ nonlinear relationship can be expressed by a polynomial function, the AC current $I_1$ and $I_2$ flowing through two diodes, are given by $$I_1 = -f(-V_d) = aV_d - bV_d^2 + cV_d^3 - dV_d^4 \ldots, -\infty < V_d < \infty \quad (1a)$$

$$I_2 = f(V_d) = aV_d + bV_d^2 + cV_d^3 + dV_d^4 \ldots, -\infty < V_d < \infty \quad (1b)$$

It can be seen from (1) that the signs of the odd-order terms i.e. $V_d$ and $V_d^3$ are the same for $I_1$ and $I_2$, while the sign of the even-order terms i.e. $V_d^2$ and are $V_d^4$ are different for $I_1$ and $I_2$. Thus, the even-order harmonics in D1 and D2 have 180° phase difference.

Figure 5:
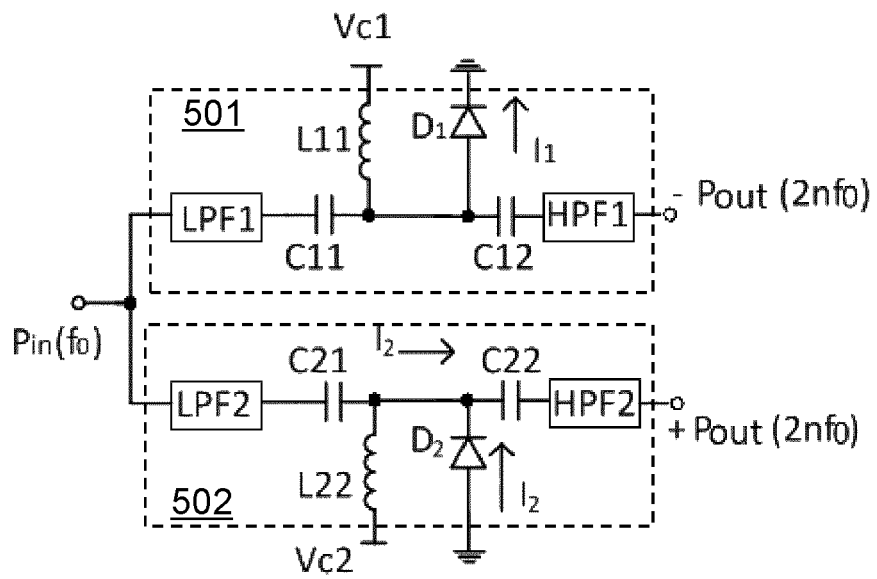
FIG. 5 is schematic block view of a frequency multiplier according to a second embodiment herein.

According to some embodiments, wherein the first and second nonlinear components NC1, NC2 may be diodes and connected in shunt in the first and second signal branches. FIG. 5 shows a frequency multiplier 500 with a shunted anti-parallel diode pair D1, D2. As shown in FIG. 5, in the first signal branch 501, the anode of the first diode D1 is connected with the single-ended input $P_{in}(f_0)$ via a capacitor C11 and the first low pass or bandpass filter LPF1 and the anode of the first diode D1 is also connected with one of the differential outputs $-P_{out}(2nf_0)$ via a capacitor C12 and the first high pass or bandpass filter HPF1, the cathode of the first diode D1 is connected to ground. In the second signal branch 502, the cathode of the second diode D2 is connected with the single-ended input $P_{in}(f_0)$ via a capacitor C21 and the second low pass or bandpass filter LPF2, and the cathode of the second diode D2 is also connected with one of the differential outputs $+P_{out}(2nf_0)$ via a capacitor C22 and the second high pass or bandpass filter HPF2, the anode of the second diode D2 is connected to ground. The anode of D1 is connected with a DC voltage supplier Vc1 via inductor L11, and the cathode of D2 is connected with a DC voltage supplier Vc2 via inductor L22, where L11 and L22 are AC chokes.

The two diodes D1 and D2 are connected in shunt in the two signal branches, where one diode's anode and the other diode's cathode are grounded. The AC voltages across two diodes D1 and D2 are 180° anti-phase, i.e. 180° phase difference, thus, the even-order harmonics at the output of two branches are 180° anti-phase too.

Figure 6:
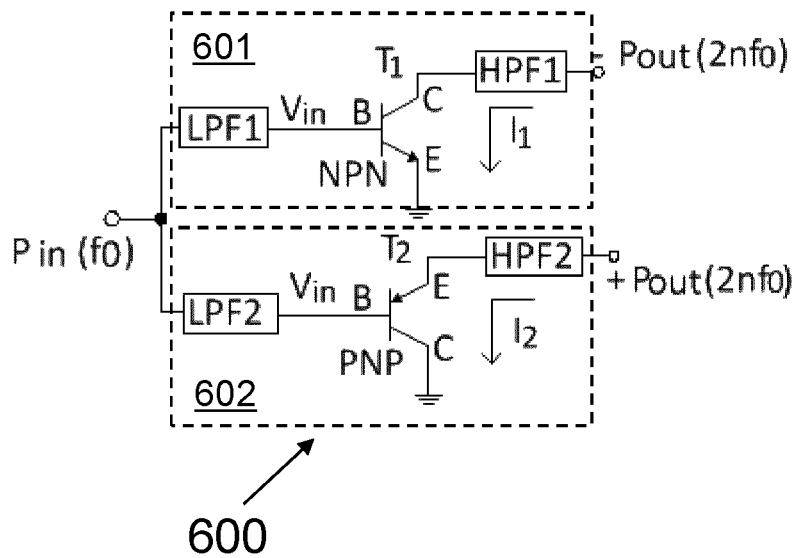
FIG. 6 is schematic block view of a frequency multiplier according to a third embodiment herein.

According to some embodiments, the first and second nonlinear components may be Heterojunction bipolar transistors (HBT) or Bipolar junction transistors (BJT) with different types, i.e. one is an NPN transistor, and one is a PNP transistor. These abbreviations note that the BJT transistor is formed with either a positively-doped semiconducting material sandwiched between two negatively-doped materials in the case of an NPN transistor, or a negatively doped material sandwiched between two positive layers in the case of PNP transistor. FIG. 6 shows a frequency multiplier 600 with a transistor pair T1, T2. In the first signal branch 601, the first nonlinear component $T_1$ is an NPN transistor with a base B, an emitter E and a collector C, the base is connected to the single-ended input $P_{in}(f_0)$ via the first low pass or bandpass filter LPF1, the emitter is connected to ground, and the collector is connected to one of the differential outputs $-P_{out}(2nf_0)$ via the first high pass or bandpass filter HPF1. In the second signal branch 602, the second nonlinear component $T_2$ is a PNP transistor with a base B, an emitter E and a collector C, the base is connected to the single-ended input $P_{in}(f_0)$ via the second low pass or bandpass filter LPF2, the collector is connected to ground, and the emitter is connected to one of the differential outputs $+P_{out}(2nf_0)$ via the second high pass or bandpass filter HPF2.

As can be seen, the proposed frequency multiplier 600 with differential outputs is based on transistors. For the NPN transistor $T_1$, the emitter is grounded, and its collector is connected to one of the differential outputs. For the PNP transistor $T_2$, the emitter is connected to one of the differential outputs and its collector is grounded. Two input signals $V_{in}$ are applied at the bases of the two transistors, respectively, and they should have the same amplitude $V_{in}$ and the same phase.

Assuming the NPN transistor and the PNP have a similar nonlinear relationship between base-emitter voltage $V_{be}$ and collector current $I_c$ can be expressed as $$I_c = f(V_{be}) = aV_{be} + bV_{be}^2 + cV_{be}^3 + dV_{be}^4 \ldots \quad (2)$$

$I_1$ and $I_2$, in FIG. 6, denote the currents at two outputs, which are given by $$I_1 = I_c = f(V_{be}) = f(V_{in}) = aV_{in} + bV_{in}^2 + cV_{in}^3 + dV_{in}^4 \ldots \text{ for NPN transistor} \quad (3a)$$

$$I_2 = -I_c = -f(V_{be}) = -f(-V_{in}) = aV_{in} - bV_{in}^2 + cV_{in}^3 - dV_{in}^4 \ldots \text{ for PNP transistor} \quad (3b)$$

It can be seen that the AC currents, $I_1$ and $I_2$, contain even-order terms of different signs, consequently, the obtained even-order harmonics at two outputs have 180° phase difference.

Figure 7:
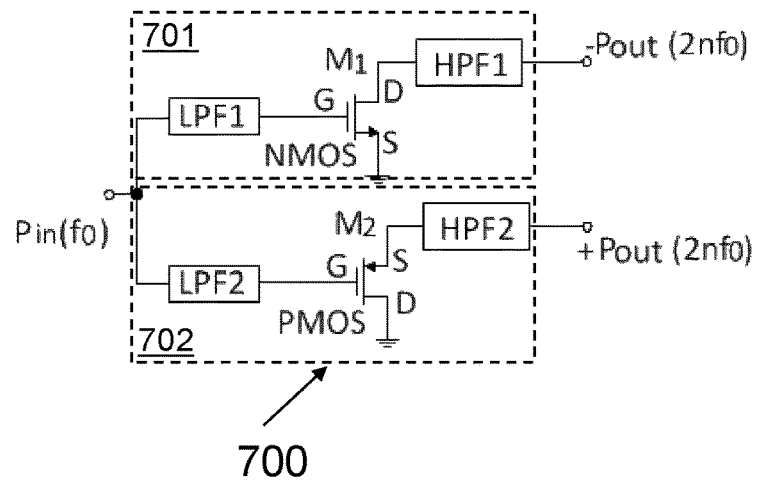
FIG. 7 is schematic block view of a frequency multiplier according to a fourth embodiment herein.

A similar analysis is applicable for a frequency multiplier based on Complementary Metal Oxide Semiconductor (CMOS) transistors in bulk or Silicon on Insulator (SOI) technology. FIG. 7 shows a frequency multiplier 700 with a CMOS pair M1, M2, i.e. a NMOS which is a MOS transistor with conductive n-type channel and a PMOS which is a MOS transistor with conductive p-type channel. Such a frequency multiplier can provide 180° anti-phase differential signals too.

So according to some embodiments, wherein the first and second nonlinear components may be a CMOS pair, one may be a PMOS transistor and one may be an NMOS transistor. In the first signal branch 701, the first nonlinear component M1 is a NMOS transistor with a gate G, a source S and a drain D, the gate is connected to the single-ended input $P_{in}(f_0)$ via the first low pass or bandpass filter LPF1, the source is grounded, and the drain is connected to one of the differential outputs $-P_{out}(2nf_0)$ via the first high pass or bandpass filter HPF1. In the second signal branch 702, the second nonlinear component M2 is a PMOS transistor with a gate G, a source S and a drain D, the gate is connected to the single-ended input $P_{in}(f_0)$ via the second low pass or bandpass filter LPF2, the drain is grounded, and the source is connected to one of the differential outputs $+P_{out}(2nf_0)$ via the second high pass or bandpass filter HPF2.

To demonstrate the function and performance of the frequency multiplier according to embodiments herein, simulations have been carried out for the frequency multiplier 400 shown in FIG. 4, where two diodes D1, D2 are connected in series at two signal branches. Both diodes D1, D2 are reverse-biased with about 0.02V. In order to show all harmonics generated by the two diodes D1, D2, the low/high-pass filters are not included in the simulation. The source impedance and the resistor loads at the output ports are 50Ω.

Figure 8:
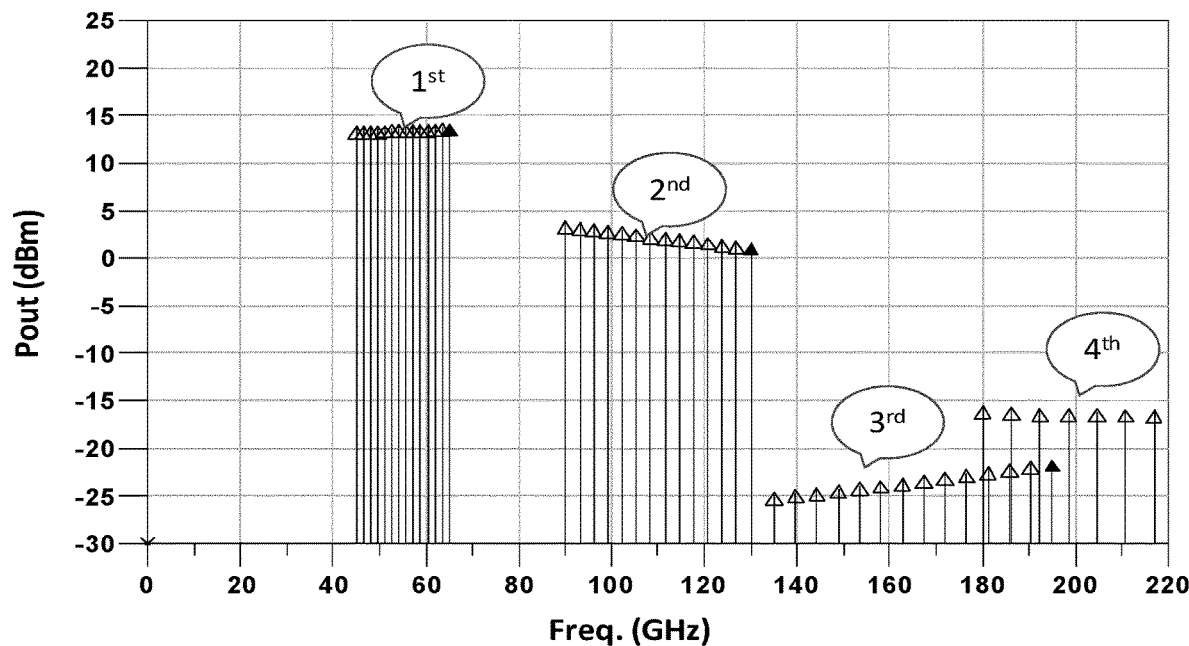
FIG. 8 is a diagram showing the simulated spectrum for the output signal of the frequency multiplier according to the first embodiments herein.

When the power of the input signal is 20 dBm and the frequency is swept from 45 GHz to 65 GHz, the obtained output spectrum at one output is shown in FIG. 8. The 2nd order harmonic has a power level from 1.4 dBm to 3.7 dBm over 90 GHz to 130 GHz. The rejection of the 3rd order harmonic is above 20 dBc relative to the 2nd harmonic. It can be seen also that the 4th order harmonics is about 15 dB lower than the 2nd order harmonic. Thus, such a circuit under the given bias may be used as a frequency doubler.

Figure 9:
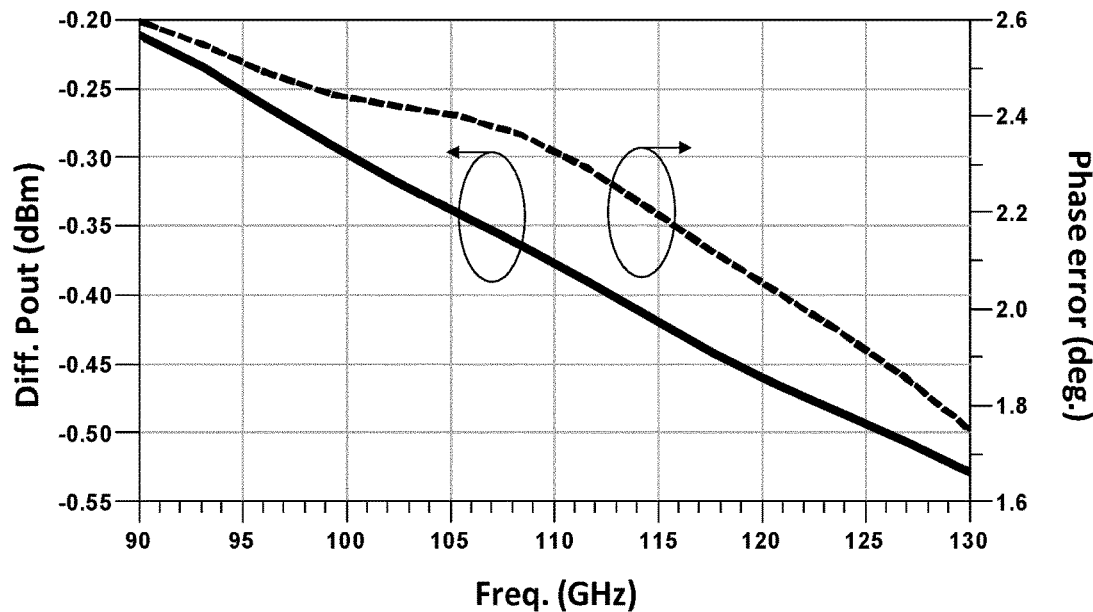
FIG. 9 is a diagram showing the simulated power difference and phase error of the differential output signal from the frequency multiplier according to the first embodiments herein.

The power difference and phase error between the differential outputs are plotted in FIG. 9. As the output frequency is swept from 90 GHz to 130 GHz, the power difference increases from 0.20 dBm to 0.55 dBm. The phase error is defined as the magnitude of the phase difference of the differential ports deviating from 180°:

$$\delta\varnothing = |180 - (\varnothing_1 - \varnothing_2)| \quad (5)$$

where $\varnothing_i$ (i=1,2) is the phase of the signal at the two outputs. As shown in FIG. 9, the phase error decreases from 2.6° to 1.8°, as frequency increases.

Simulations have also been performed for the frequency multiplier 500 with two shunted anti-diodes as shown in FIG. 5. The two diodes D1, D2 are forward biased with a bias voltage of 0.4V. The input power is 20 dBm, the frequency of the input signal is swept from 45 GHz to 65 GHz.

Figure 10:
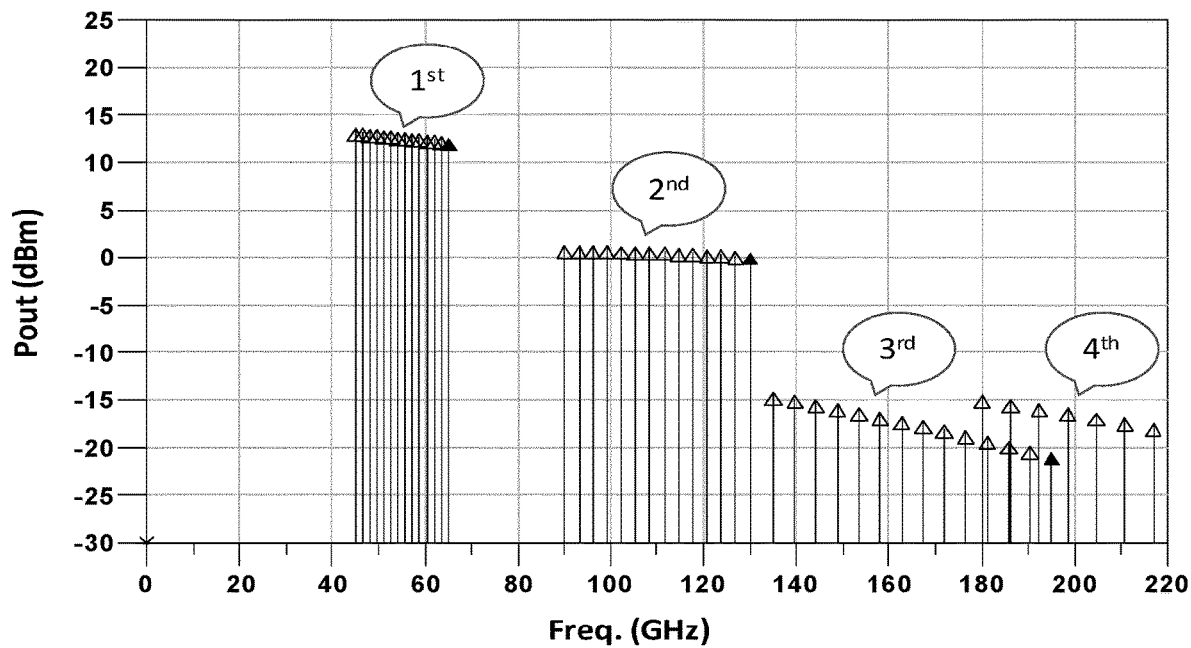
FIG. 10 is a diagram showing the simulated spectrum for the output signal of a frequency multiplier according to the second embodiments herein.
Figure 11:
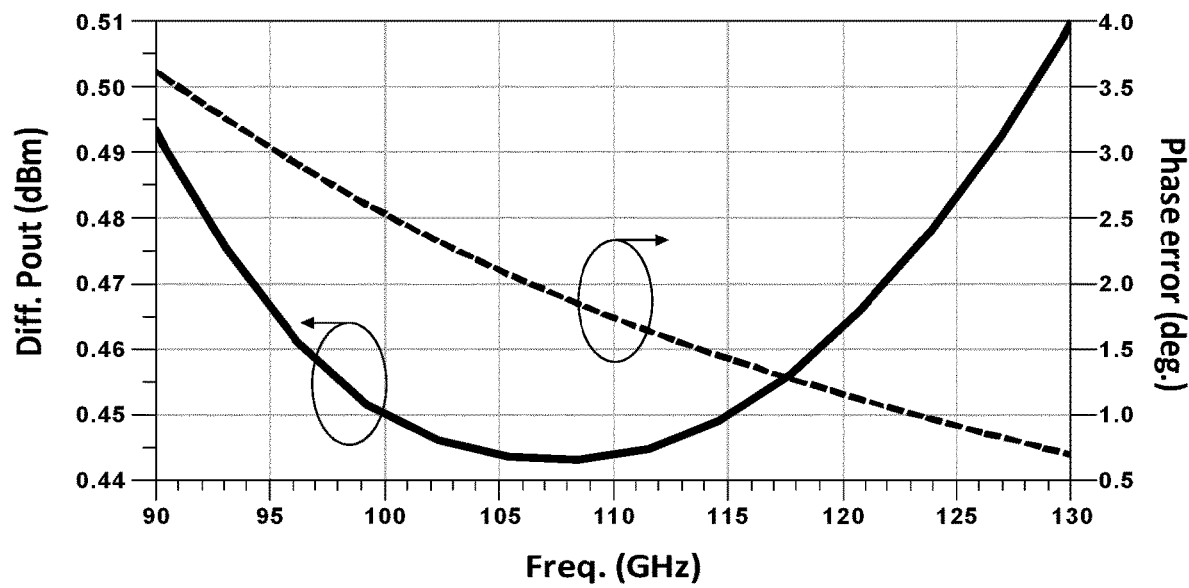
FIG. 11 is a diagram showing the simulated power difference and phase error of the differential output signal from the frequency multiplier according to the second embodiments herein.

The obtained output spectrum at one of the differential outputs is plotted in FIG. 10. The power of the $2^{nd}$ order harmonic is about 0 dBm. The rejection of the $3^{rd}$ order harmonic is larger than 15 dBc. The power difference between two outputs and the phase error are plotted in FIG. 11. The power difference is less than 0.5 dBm and the phase error is less than 3.5°.

To summarize, the frequency multipliers 300, 400, 500, 600, 700 according to embodiments herein use either two diodes or two transistors to form two signal branches, the two signal branches are driven by a common input signal at frequency $f_0$, while the output signals of the two signal branches have 180° phase difference at the frequency of $2nf_0$, where n=1, 2, 3 . . . .

The two diodes are supposed to be an anti-parallel pair, which may be connected either in series or in shunt in the two signal branches.

The two transistors may be a BJT pair, e.g. an NPN and a PNP transistors pair. Input signals are applied at the bases of the two transistors. For the NPN transistor, the emitter is grounded, and the collector is connected to one of the differential output. For the PNP transistor, the emitter is connected to one of the differential output and the collector is grounded.

Two transistors may also be a CMOS pair, e.g. an NMOS and a PMOS transistors pair. Input signals are applied at the gates of the two transistors, respectively. For the NMOS transistor, the source is grounded, and the drain is connected to one of the differential output. For the PMOS transistor, the drain is grounded, and the source is connected to one of the differential output.

A low pass or bandpass filter may be applied between the input and the diode/transistor, while a high pass or bandpass filter may be applied to the output of the diode/transistor in each signal branch to get the desired harmonic and suppress the unwanted harmonics. These filters may be used for impedance matching as well.

Neither a balun nor a phase shifter or a 90° hybrid is needed in the frequency multipliers 300, 400, 500, 600, 700 according to embodiments herein. Thus, the losses associated with the balun or the phase shifter or the 90° hybrid are avoided.

Consequently, the bandwidth limitation due to a balun or a phase shifter or 90° hybrid is eliminated. Thus, the frequency multipliers 300, 400, 500, 600, 700 according to embodiments herein are able to operate in a wide frequency range.

Without using any balun or phase shifter or 900 hybrid, the frequency multipliers 300, 400, 500, 600, 700 according to embodiments herein become more compact and occupy less chip area.

Figure 12:
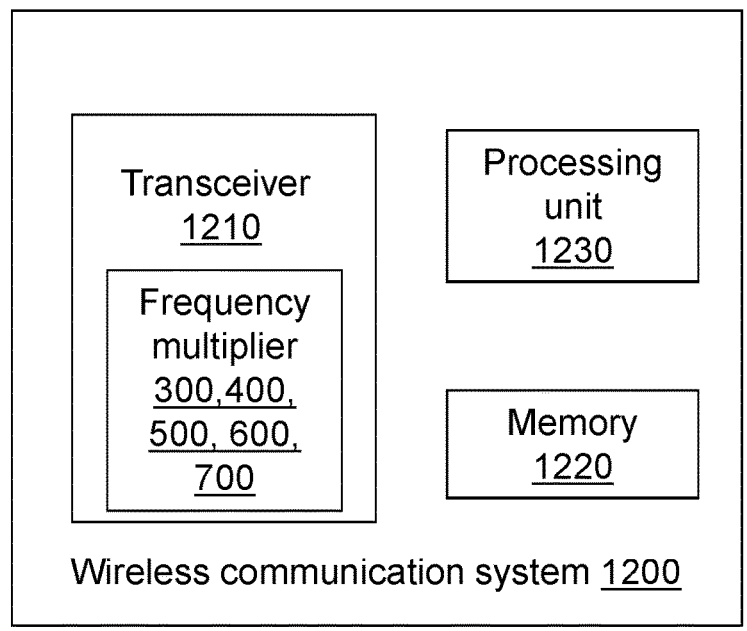
FIG. 12 is a block diagram illustrating a wireless communication system in which embodiments herein may be implemented.

The frequency multipliers 300, 400, 500, 600, 700 according to embodiments herein are suitable for transceivers such as microwave and millimeter-wave transceivers as an RF signal source generator, for example to generate W-band or D-band signals, in a wireless communication system 1200 as shown in FIG. 12. The wireless communication system 1200 comprises a Transceiver 1210, wherein the frequency multipliers 300, 400, 500, 600, 700 may be implemented in. The wireless communication system 1200 further comprises a Memory 1220 and a Processing unit 1230.

The embodiments herein are not limited to the above described preferred embodiments. Various alternatives, modifications and equivalents may be used. Therefore, the above embodiments should not be taken as limiting the scope of the invention, which is defined by the appended claims.

The invention claimed is:

1. A frequency multiplier configured to generate differential output signals from a single-ended input signal, the frequency multiplier comprising:
   a single-ended input to receive the input signal with a frequency of $f_0$;
   differential outputs to provide the differential output signals;
   a first signal branch connected to the single-ended input and one of the differential outputs, wherein the first signal branch comprises a first filter, a first nonlinear component, and a second filter; and
   a second signal branch connected to the single-ended input and another one of the differential outputs, wherein the second signal branch comprises a third filter, a second nonlinear component, and a fourth filter;
   wherein the first filter and the third filter each has a center frequency of $f_0$ and is either a low pass or bandpass filter;
   wherein the second filter and the fourth filter each has a center frequency of $2nf_0$ and is either a high pass or bandpass filter;
   wherein the first and second nonlinear components are configured such that even-order harmonics generated in the first and second nonlinear components are in antiphase and the differential output signals are generated with a frequency of 2n times the frequency of the input signal at the differential outputs, wherein n is an integer number;
   wherein the first and second nonlinear components are connected in series in the first and second signal branches;
   wherein, in the first signal branch, the first nonlinear component is a first diode comprising a first cathode and a first anode, the first cathode being connected with the single-ended input via a first capacitor and the first filter, and the first anode being connected with the one of the differential outputs via a second capacitor and the second filter; and
   wherein, in the second signal branch, the second nonlinear component is a second diode comprising a second cathode and a second anode, the second anode being connected with the single-ended input via a third capacitor and the third filter, the second cathode being connected with the other of the differential outputs via a fourth capacitor and the fourth filter; and
   wherein the first and second cathodes are grounded via respective inductors, while the first and second anodes are connected to DC suppliers via inductors respectively.

2. The frequency multiplier of claim 1, wherein the frequency multiplier is comprised within a transceiver.

3. The frequency multiplier of claim 1, wherein the frequency multiplier is comprised within a wireless communication system.

4. A frequency multiplier configured to generate differential output signals from a single-ended input signal, the frequency multiplier comprising:
   a single-ended input to receive the input signal with a frequency of $f_0$;
   differential outputs to provide the differential output signals;
   a first signal branch connected to the single-ended input and one of the differential outputs, wherein the first signal branch comprises a first filter, a first nonlinear component, and a second filter; and
   a second signal branch connected to the single-ended input and another one of the differential outputs, wherein the second signal branch comprises a third filter, a second nonlinear component, and a fourth filter;
   wherein the first filter and the third filter each has a center frequency of $f_0$ and is either a low pass or bandpass filter;
   wherein the second filter and the fourth filter each has a center frequency of $2nf_0$ and is either a high pass or bandpass filter;
   wherein the first and second nonlinear components are configured such that even-order harmonics generated in the first and second nonlinear components are in antiphase and the differential output signals are generated with a frequency of 2n times the frequency of the input signal at the differential outputs, wherein n is an integer number;
   wherein the first and second nonlinear components are connected in shunt in the first and second signal branches;
   wherein, in the first signal branch, the first nonlinear component is a first diode comprising a first anode and a first cathode, the first anode being connected with the single-ended input via a first capacitor and the first filter, the first anode being also connected with the one of the differential outputs via a second capacitor and the second filter, the first cathode of the first diode being grounded;
   wherein the second nonlinear component is a second diode comprising a second anode and a second cathode, wherein the second anode is connected with a first DC supply via a first inductor; and
   wherein, in the second signal branch, the second cathode is connected with the single-ended input via a third capacitor and the third filter, the second cathode is also connected with the other of the differential outputs via a fourth capacitor and the fourth filter, the second anode of the second diode is grounded, and the second cathode is connected with a second DC supply via a second inductor.

5. The frequency multiplier of claim 4, wherein the frequency multiplier is comprised within a transceiver.

6. The frequency multiplier of claim 4, wherein the frequency multiplier is comprised within a wireless communication network.

7. A frequency multiplier configured to generate differential output signals from a single-ended input signal, the frequency multiplier comprising:
   a single-ended input to receive the input signal with a frequency of $f_0$;
   differential outputs to provide the differential output signals;
   a first signal branch connected to the single-ended input and one of the differential outputs, wherein the first signal branch comprises a first filter, a first nonlinear component, and a second filter; and
   a second signal branch connected to the single-ended input and another one of the differential outputs, wherein the second signal branch comprises a third filter, a second nonlinear component, and a fourth filter;
   wherein the first filter and the third filter each has a center frequency of $f_0$ and is either a low pass or bandpass filter;
   wherein the second filter and the fourth filter each has a center frequency of $2nf_0$ and is either a high pass or bandpass filter;
   wherein the first and second nonlinear components are configured such that even-order harmonics generated in the first and second nonlinear components are in antiphase and the differential output signals are generated with a frequency of 2n times the frequency of the input signal at the differential outputs, wherein n is an integer number;
   wherein the first and second nonlinear components are bipolar junction transistors with different types;
   wherein, in the first signal branch, the first nonlinear component is a negative-positive-negative (NPN) transistor comprising a first base, a first emitter, and a first collector;
   wherein the first base is connected to the single-ended input via the first filter, the first emitter is grounded, and the first collector is connected to the one of the differential outputs via the second filter; and
   wherein, in the second signal branch, the second nonlinear component is a positive-negative-positive (PNP) transistor comprising a second base, a second emitter, and a second collector;
   wherein the second base is connected to the single-ended input via the third filter, the second collector is grounded, and the second emitter is connected to the other of the differential outputs via the fourth filter.

8. The frequency multiplier of claim 7, wherein the frequency multiplier is comprised within a transceiver.

9. The frequency multiplier of claim 7, wherein the frequency multiplier is comprised within a wireless communication network.

10. A frequency multiplier configured to generate differential output signals from a single-ended input signal, the frequency multiplier comprising:
    a single-ended input to receive the input signal with a frequency of $f_0$;
    differential outputs to provide the differential output signals;
    a first signal branch connected to the single-ended input and one of the differential outputs, wherein the first signal branch comprises a first filter, a first nonlinear component, and a second filter; and
    a second signal branch connected to the single-ended input and another one of the differential outputs, wherein the second signal branch comprises a third filter, a second nonlinear component, and a fourth filter;
    wherein the first filter and the third filter each has a center frequency of $f_0$ and is either a low pass or bandpass filter;
    wherein the second filter and the fourth filter each has a center frequency of $2nf_0$ and is either a high pass or bandpass filter;
    wherein the first and second nonlinear components are configured such that even-order harmonics generated in the first and second nonlinear components are in antiphase and the differential output signals are generated with a frequency of 2n times the frequency of the input signal at the differential outputs, wherein n is an integer number;
    wherein the first and second nonlinear components are metal oxide semiconductor (MOS) transistors with different types;
    wherein, in the first signal branch, the first nonlinear component is an N-type metal-oxide-semiconductor (NMOS) transistor comprising a first gate, a first source, and a first drain;
    wherein the first gate is connected to the single-ended input via the first filter, the first source is grounded, and the first drain is connected to the one of the differential outputs via the second filter; and
    wherein, in the second signal branch, the second nonlinear component is a p-channel metal-oxide semiconductor (PMOS) transistor comprising a second gate, a second source, and a second drain;
    wherein the second gate is connected to the single-ended input via the third filter, the second drain is grounded, and the second source is connected to the other of the differential outputs via the fourth filter.

11. The frequency multiplier of claim 10, wherein the frequency multiplier is comprised within a transceiver.

12. The frequency multiplier of claim 10, wherein the frequency multiplier is comprised within a wireless communication network.

* * * * *